United States Patent [19]
Mahant-Shetti et al.

[11] Patent Number: 5,488,315
[45] Date of Patent: Jan. 30, 1996

[54] ADDER-BASED BASE CELL FOR FIELD PROGRAMMABLE GATE ARRAYS

[75] Inventors: Shivaling S. Mahant-Shetti; Manisha Agarwala, both of Richardson, Tex.; Mahesh M. Mehendale, Bangalore, Ind.; Robert J. Landers, Plano; Mark G. Harward, Dallas, both of Tex.

[73] Assignee: Texas Instruments Incorporated, Dallas, Tex.

[21] Appl. No.: 369,060

[22] Filed: Jan. 5, 1995

[51] Int. Cl.$^6$ .......................... H03K 19/173; H03K 19/177
[52] U.S. Cl. .................. 326/37; 326/39; 326/41; 326/53; 364/768
[58] Field of Search ................ 326/37, 39, 53, 326/21, 41, 47; 327/407; 364/768

[56] References Cited

U.S. PATENT DOCUMENTS

| | | | |
|---|---|---|---|
| 4,878,192 | 10/1989 | Nishiyama et al. | 364/768 |
| 5,122,685 | 6/1992 | Chan et al. | 326/41 |
| 5,338,983 | 8/1994 | Agarwala | 326/39 |
| 5,424,655 | 6/1995 | Chua | 326/39 |

*Primary Examiner*—Edward P. Westin
*Assistant Examiner*—Jon Santamauro
*Attorney, Agent, or Firm*—Jacqueline J. Garner; Richard L. Donaldson; William E. Hiller

[57] ABSTRACT

An adder-based base cell (10) is provided for field programmable gate arrays. The base cell (10) includes a first inverter (13) operable to receive a first input signal (A). A first NAND gate (12) is coupled to the first inverter (13) and is operable to receive a second input signal (B). A first 2:1 multiplexer (14) is coupled to the first NAND gate (12) and is operable to receive a third input signal (C). The output of the first 2:1 multiplexer (14) represents a first function (F1). A second inverter (17) is operable to receive a fourth input signal (D). A second NAND gate (16) is coupled to the second inverter (17) and is operable to receive a fifth input signal (E). An XOR gate (18) is coupled to the second NAND gate (16), is operable to receive a sixth input signal (F), and is coupled to the first 2:1 multiplexer (14). The output of the XOR gate represents a partial sum function (PS_1). A second 2:1 multiplexer (19) is operable to receive a seventh input signal (G), is operable to receive an eighth input signal (H) and is coupled to the XOR gate (18). The output of the second 2:1 multiplexer (19) represents a second function (F2).

15 Claims, 3 Drawing Sheets

ADDER-BASED BASE CELL FOR FIELD PROGRAMMABLE GATE ARRAYS

TECHNICAL FIELD OF THE INVENTION

This invention relates in general to the field of electronic devices, and more specifically to an adder-based base cell for field programmable gate arrays.

BACKGROUND OF THE INVENTION

Field programmable gate arrays (FPGAs) are a rapidly evolving technology in the application-specific integrated circuit (ASIC) area. The increasing use of FPGAs in ASICs is due to the fact that they combine the flexibility of mask programmable gate arrays (MPGAs) with the convenience of field programmability.

A typical FPGA architecture consists of a two-dimensional array of logic modules or base cells that can be selectively connected using a programmable interconnect structure. The architecture includes rows of base cells interspersed with routing channels consisting of predefined tracks. The tracks are segmented and two adjacent segments can be connected by programming a horizontal antifuse.

In addition to the horizontal antifuses, there are crosspoint antifuses that are used to make connections between the horizontal and the vertical tracks. FPGA architectures typically utilize a base cell that incorporates multiplexer-based logic design. The output of each base cell is connected to a dedicated vertical segment. Other vertical segments pass through the base cells serving as feed-through between channels.

The choice of architecture for base cells and the method by which the base cells are configured directly affects the usefulness and performance of an FPGA for a particular application. Performance depends mainly on the number of antifuses used and the critical path delay.

The area required for one logic implementation in comparison to another depends upon a combination of size and number of base cells required and the routing and programming resources available. A large complex base cell requires more physical area but can implement many logic functions. Thus, a smaller total number of base cells may be required for a particular design. However, the large base cells may be underutilized, resulting in wasted logic gates. On the other hand, if the base cells are too small and simple, a large number of base cells would be required to implement a complex logic function, resulting in a large interconnection requirement. Thus, there is a trade-off between the base cell size and the number of base cells required to implement a desired function.

It is desirable that the structure of a base cell be such that it can implement as many useful functions as possible using a single base cell yet require as little space as possible.

SUMMARY OF THE INVENTION

Therefore, a need has arisen for a base cell for field programmable gate arrays that provides a large number of useful functions while requiring a relatively small amount of space.

In accordance with the present invention, an adder-based base cell for field programmable gate arrays is provided that substantially eliminates or reduces disadvantages and problems associated with prior base cells.

According to one embodiment of the present invention, an adder-based base cell for field programmable gate arrays is provided. The base cell includes a first inverter operable to receive a first input signal. A first NAND gate is coupled to the first inverter and is operable to receive a second input signal. A first 2:1 multiplexer is coupled to the first NAND gate and is operable to receive a third input signal. A second inverter is operable to receive a fourth input signal. A second NAND gate is coupled to the second inverter and is operable to receive a fifth input signal. An XOR gate is coupled to the second NAND gate, is operable to receive a sixth input signal, and is coupled to the first 2:1 multiplexer. A second 2:1 multiplexer is operable to receive a seventh input signal, is operable to receive an eighth input signal and is coupled to the XOR gate.

BRIEF DESCRIPTION OF THE DRAWINGS

A more complete understanding of the present invention may be acquired by referring to the following description taken in conjunction with the accompanying drawings in which like reference numbers indicate like features and wherein.

DETAILED DESCRIPTION OF THE INVENTION

Figure 1:
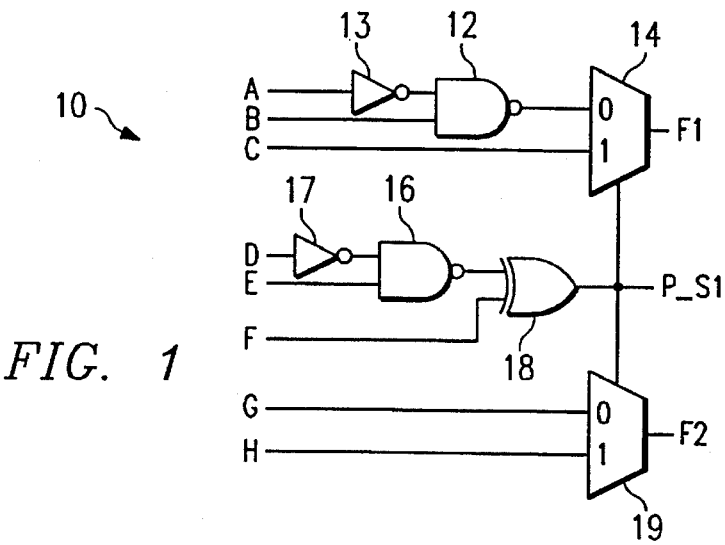
FIG. 1 illustrates one embodiment of an adder-based base cell constructed according to the teachings of the present invention.

FIG. 1 illustrates a base cell, indicated generally at 10, constructed according to the teachings of the present invention. Base cell 10 implements latches and generates a number of useful functions. Base cell 10 generates all two input functions, a large number of three input functions and several useful four, five and six input functions.

As shown in FIG. 1, base cell 10 receives eight input signals, A through H, and provides two output signals, F1 and F2. An additional output signal P_S1 is also available, as shown. However, for many applications, the P_S1 output signal would not add value to the overall functionality of base cell 10. Consequently, there may be no need to make P_S1 available as an output signal.

Base cell 10 includes a NAND gate 12 having two inputs and an output. An inverter 13 has an output coupled to one input of NAND gate 12. Inverter 13 has an input coupled to input signal A. Input signal B is coupled to the other input of NAND gate 12. A 2:1 multiplexer 14 provides an output and receives a "0" input, a "1" input and a "select" input. The output of multiplexer 14 comprises a first function F1. The output of NAND gate 12 is coupled to the "0" input of multiplexer 14, and input signal C is coupled to the "1" input of multiplexer 14.

Base cell 10 also includes a NAND gate 16 having an output and receiving two inputs. An inverter 17 provides an output to one input of NAND gate 16. Inverter 17 receives input signal D. Input signal E is coupled to the other input of NAND gate 16. An exclusive-or (XOR) gate 18 receives two inputs and provides an output. The output of XOR gate 18 comprises a partial sum function P_S1. The output of XOR gate 18 is coupled to the "select" input of multiplexer 14. Input signal F is coupled to one input of XOR gate 18, and the output of NAND gate 16 is coupled to the other input of XOR gate 18.

Base cell 10 further includes a 2:1 multiplexer 19 that receives a "0" input, a "1" input and a "select" input and provides an output. The output of multiplexer 19 comprises a second function F2. The "0" input and the "1" input of multiplexer 19 are coupled to input signals G and H as shown. The output of XOR gate 18 is coupled to the "select" input of multiplexer 19.

Base cell 10 operates to generate 167 functions at output F1 depending upon the connections of input signals A through F. Output F2 implements 46 functions depending upon the connections of input signals D through H. All of these functions are included in those generated at F1. F1 can implement functions of input signals A through F, and F2 can implement functions of input signals D through H. Partial sum function P_S1 allows the implementation of a full adder. In base cell 10, output P_S1 operates during an adder implementation similar to a conventional partial sum output. The following table summarizes the number of functions generated at F1 and F2.

TABLE I

| INPUTS | F1 | F2 |
|---|---|---|
| 1 | 2 | 2 |
| 2 | 8 | 8 |
| 3 | 48 | 21 |
| 4 | 87 | 14 |
| 5 | 21 | 1 |
| 6 | 1 | — |
| TOTAL | 167 | 46 |
| TOTAL F1 & F2 | | 167 |

As can be seen from Table I, base cell 10 can implement all one and two input functions. Base cell 10 implements 48 three input functions, 87 four input functions, 21 five input functions, and one six input function. Further, base cell 10 can implement a full adder without the need for additional base cells.

The combinations of inverters and NAND gates, such as that for input signals A and B, provide an ability to utilize a signal or its complement. A base cell obtained by replacing the NAND gates 12 and 16 in base cell 10 with NOR gates will have similar functionality. The gates are illustrated as NAND gates for this embodiment only. The number of functions is identical when NOR gates are used, and 82 of those functions are common to those implemented with NAND gates.

Figure 2:
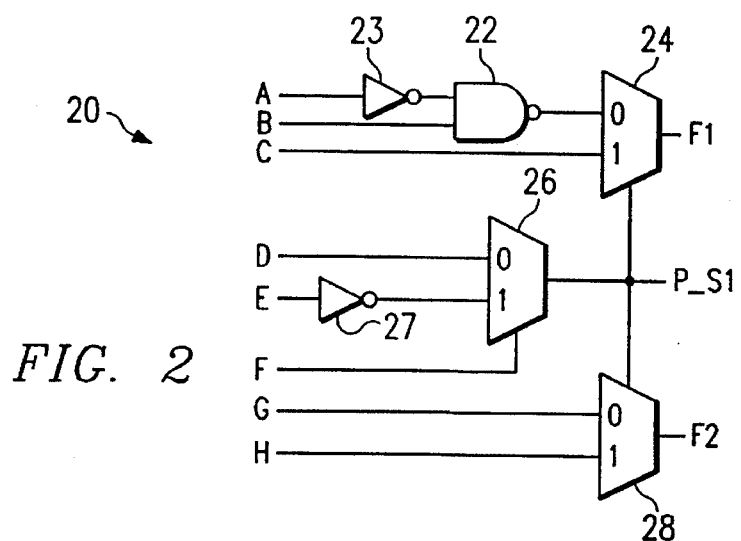
FIG. 2 illustrates another embodiment of an adder-based base cell constructed according to the teachings of the present invention.

FIG. 2 illustrates another embodiment of a base cell, indicated generally at 20, constructed according to the teachings of the present invention. Base cell 20 provides two output signals F1 and F2, as shown. Similar to base cell 10 of FIG. 1, base cell 20 also has a third output signal P_S1 that is usually not made available.

Base cell 20 includes a NAND gate 22 having an output and receiving two inputs. An inverter 23 provides an output to one input of NAND gate 22 and has an input coupled to input signal A. Input signal B is coupled to the other input of NAND gate 22. A 2:1 multiplexer 24 receives a "0" input, a "1" input and a "select" input and provides an output. The output of multiplexer 24 comprises a first function F1. Input signal C and the output of NAND gate 22 are coupled to multiplexer 24 as shown.

Base cell 20 also includes a 2:1 multiplexer 26 that receives a "0" input, a "1" input and a "select" input and provides an output. An inverter 27 provides an output to the "1" input of multiplexer 26 and has an input coupled to input signal E. Input signal D is coupled to the "0" input of multiplexer 26 as shown. Input signal F is coupled to the "select" input of multiplexer 26. The output of multiplexer 26 is a partial sum function P_S1.

Base cell 20 further includes a 2:1 multiplexer 28 that receives a "0" input, a "1" input and a "select" input and provides an output. The input signals G and H are connected to the "0" input and the "1" input of multiplexer 28 as shown. The output of multiplexer 28 comprises a second function F2. As shown, the output of multiplexer 26 is coupled to the "select" input of both multiplexer 24 and multiplexer 28.

Base cell 20 operates to implement a number of functions. Base cell 20 can also be configured to implement a D-latch, a D-latch with enable, a D-latch with clear, a D-latch with preset, and a D flipflop. Base cell 20 implements a total of 139 functions. The following table summarizes the number of functions generated at F1 and F2.

TABLE II

| INPUTS | F1 | F2 |
|---|---|---|
| 1 | 2 | 2 |
| 2 | 8 | 8 |
| 3 | 41 | 21 |
| 4 | 68 | 14 |
| 5 | 19 | 1 |
| 6 | 1 | — |
| TOTAL | 139 | 46 |
| TOTAL F1 & F2 | | 139 |

As with base cell 10, base cell 20 implements a number of functions as well as implementing a full adder without the need for an additional base cell. Further, base cell 20 is operable to implement D-latches. In an alternate embodiment of base cell 20, an additional base cell configuration is implemented by inserting an inverter and NAND gate combination between input signal G and multiplexer 28, making the base cell more symmetric. This modification creates three similar subcells.

Figure 3:
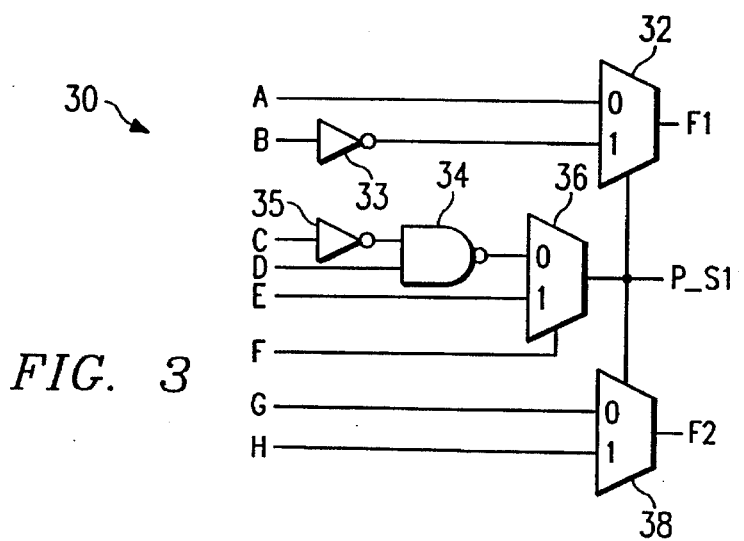
FIG. 3 illustrates a further embodiment of an adder-based base cell constructed according to the teachings of the present invention.

FIG. 3 illustrates a further embodiment of a base cell, indicated generally at 30, constructed according to the teachings of the present invention. Base cell 30 is similar to base cell 20 but implements a larger number of functions at the F2 output.

Base cell 30 includes a 2:1 multiplexer 32 that provides an output and receives a "0" input, a "1" input and a "select" input. Multiplexer 32 provides an output that comprises a first function F1. An inverter 33 provides an output that is coupled to the "1" input of multiplexer 32 as shown. Input signal A is coupled to the "0" input of multiplexer 32, and input signal B is coupled to inverter 33.

Base cell 30 also includes a NAND gate 34 that provides an output and receives two inputs. An inverter 35 provides an output that is coupled to one input of NAND gate 34. Input signal D is coupled to NAND gate 34, and input signal C is coupled to inverter 35 as shown. A 2:1 multiplexer 36 receives a "0" input, a "1" input and a "select" input and provides an output. The output of multiplexer 36 is a partial sum function P_S1. The output of NAND gate 34 and input signals E and F are connected to the "0" input, the "1" input and the "select" input of multiplexer 36 as shown. The output of multiplexer 36 is coupled to the "select" input of multiplexer 32.

Base cell 30 also includes a 2:1 multiplexer 38 that provides an output and receives a "0" input, a "1" input and a "select" input. The output of multiplexer 38 comprises a second function F2. Multiplexer 38 receives the output of multiplexer 36 as the "select" input. Input signals G and H are connected to the "0" input and the "1" input of multiplexer 38 as shown.

The functions generated by base cell 30 of FIG. 3 are greater in number than those generated by base cell 10 or base cell 20. The functions implemented at F2 of base cell 30 provide additional functions not implemented at F1. This increases the total number of functions implemented by base cell 30. The following table summarizes the number of functions generated by base cell 30.

TABLE III

| INPUTS | F1 | F2 |
| --- | --- | --- |
| 1 | 2 | 2 |
| 2 | 8 | 8 |
| 3 | 40 | 26 |
| 4 | 54 | 53 |
| 5 | 15 | 18 |
| 6 | 1 | 1 |
| TOTAL | 139 | 108 |
| TOTAL F1 & F2 | | 179 |

Figure 4:
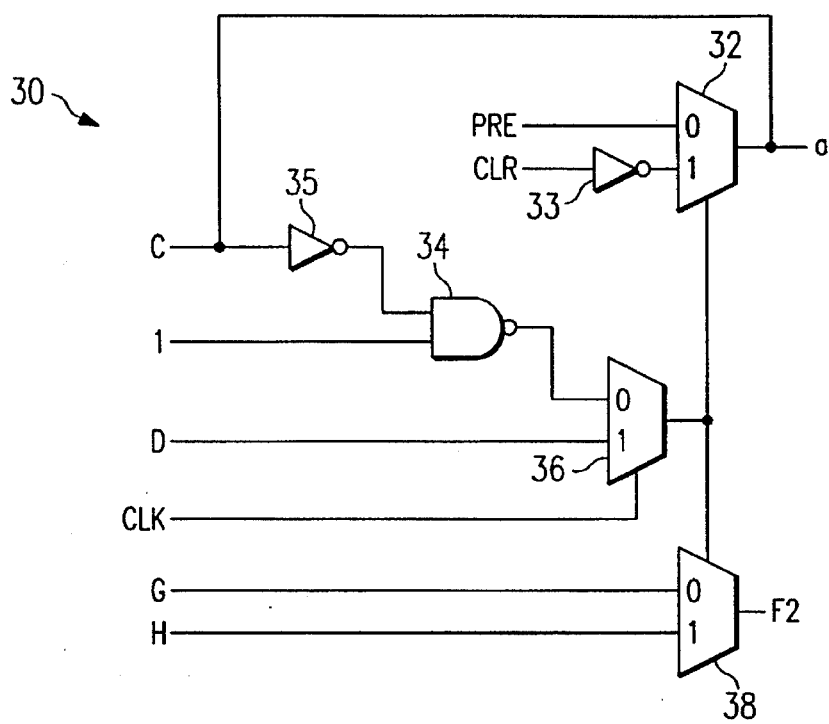
FIG. 4 illustrates a D-latch implementation using the base cell of FIG. 3.

FIG. 4 illustrates a D-latch with preset and clear implemented using base cell 30 of FIG. 3. In this implementation, input signal E comprises the D input of the D-latch. Input signal C is connected to the output of multiplexer 32. F1 comprises the Q output of the D-latch. Input signal A comprises the preset input PRE, and input signal B comprises the clear signal CLR. Input signal D is set to a logic high. Input signal F is the clock input CLK, and inputs G and H are unused. Connected in this way, base cell 30 implements a D-latch with a preset and clear.

A technical advantage of the present invention is the ability during synthesis of full adders and latches to implement a full adder with only one base cell. A further technical advantage is that this same base cell can implement latches and flipflops.

Figure 5A:
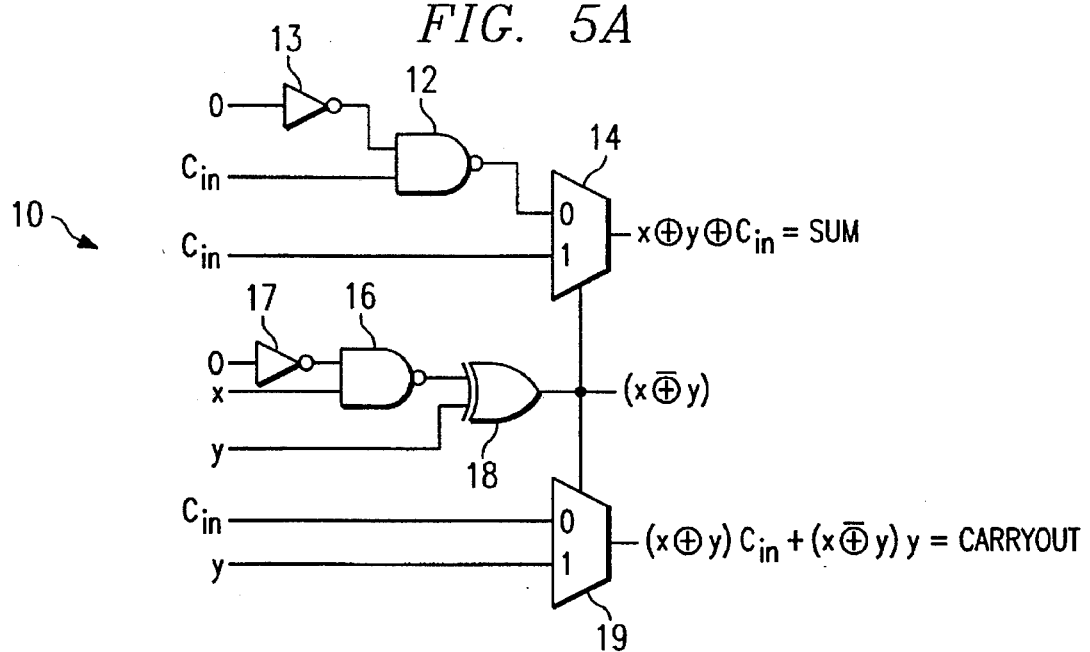
FIGS. 5A, 5B and 5C illustrate full adder implementations using the base cells of FIG. 1, FIG. 2 and FIG. 3, respectively.
Figure 5B:
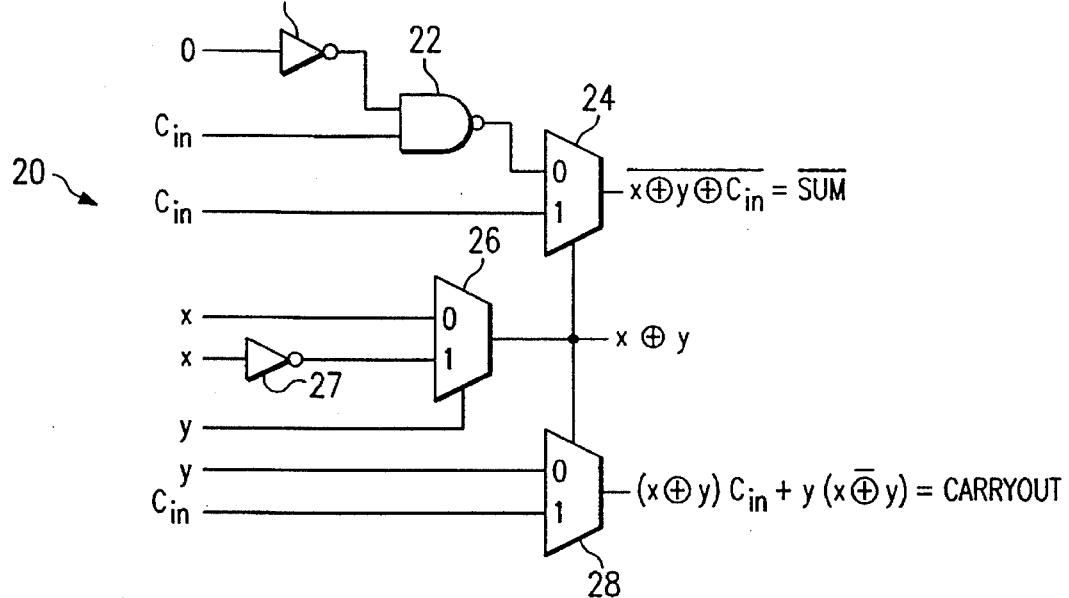
Figure 5C:
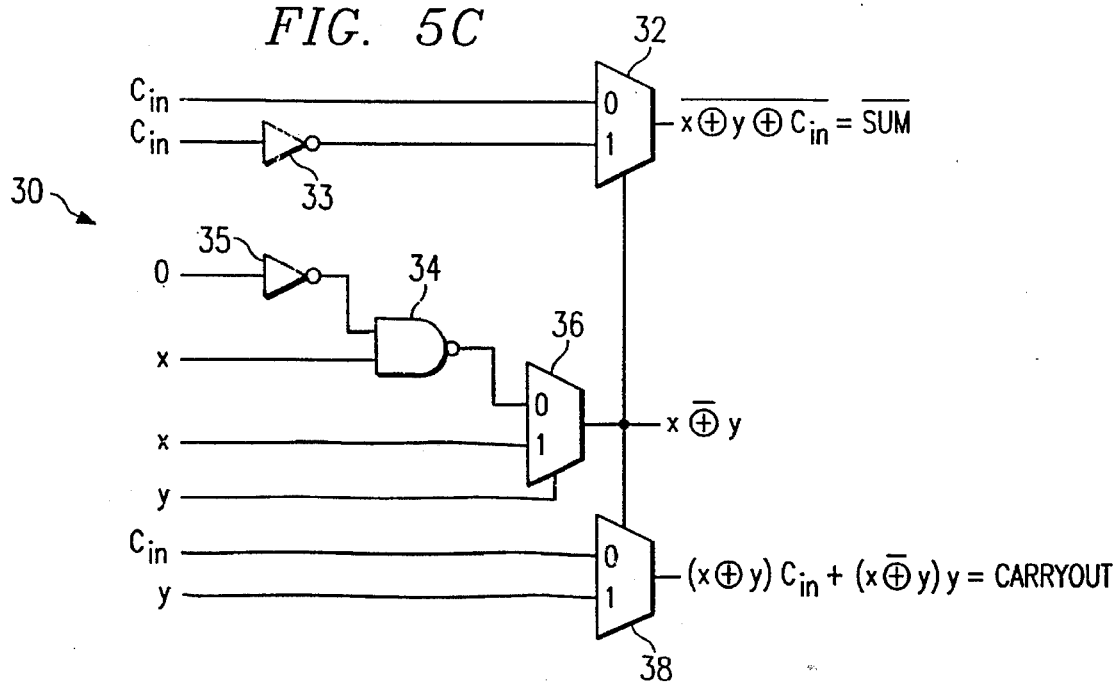

FIGS. 5A, 5B and 5C illustrate implementations of full adders using base cell 10, base cell 20 and base cell 30, respectively. As shown in FIG. 5A, inputs signals A through H of base cell 10 are connected to the carry-in $C_{in}$, and to the addends x and y. Output signals F1 and F2 then represent the sum of x and y, SUM, and the carry-out, CARRYOUT, as shown.

FIG. 5B illustrates a full adder implementation using base cell 30. Input signals A through H of base cell 30 are connected to the carry-in $C_{in}$ and to the addends x and y as shown. Output signals F1 and F2 then represent the inverse of the sum of x and y, SUM, and the carry-out, CARRYOUT. In another embodiment, swapping the inputs of multiplexer 24 would result in F1 representing the sum rather than the inverse of the sum.

FIG. 5C illustrates a full adder implementation using base cell 30 of FIG. 3. Input signals A through F of base cell 30 are connected to the carry-in $C_{in}$ and to the addends x and y, as shown. Output signals F1 and F2 then represent the inverse of the sum of x and y, SUM, and the carry-out, CARRYOUT.

Although the present invention has been described in detail, it should be understood that various changes, substitutions and alterations can be made hereto without departing from the spirit and scope of the invention as defined by the appended claims.

What is claimed is:

1. A base cell for a field programmable gate array, comprising:

a first inverter having an input and an output, the input of the first inverter operable to receive a first input signal to the base cell;

a first NAND gate having a first input, a second input and an output, the first input of the first NAND gate coupled to the output of the first inverter and the second input of the first NAND gate operable to receive a second input signal to the base cell;

a first 2:1 multiplexer having a "0" input, a "1" input, a "select" input and an output, the "0" input of the first 2:1 multiplexer coupled to the output of the first NAND gate and the "1" input of the first 2:1 multiplexer operable to receive a third input signal to the base cell, such that the output of the first 2:1 multiplexer represents a first function;

a second inverter having an input and an output, the input of the second inverter operable to receive a fourth input signal to the base cell;

a second NAND gate having a first input, a second input and an output, the first input of the second NAND gate coupled to the output of the second inverter and the second input of the second NAND gate operable to receive a fifth input signal to the base cell;

an XOR gate having a first input, a second input and an output, the first input of the XOR gate coupled to the output of the second NAND gate, the second input of the XOR gate operable to receive a sixth input signal to the base cell, and the output of the XOR gate coupled to the "select" input of the first 2:1 multiplexer, such that the output of the XOR gate represents a partial sum function;

a second 2:1 multiplexer having a "0" input, a "1" input, a "select" input and an output, the "0" input of the second 2:1 multiplexer operable to receive a seventh input signal to the base cell, the "1" input of the second 2:1 multiplexer operable to receive an eighth input signal to the base cell and the "select" input of the second 2:1 multiplexer coupled to the output of the XOR gate, such that the output of the second 2:1 multiplexer represents a second function.

2. The base cell of claim 1, wherein the output of the first 2:1 multiplexer represents a full adder sum output and the output of the second 211 multiplexer represents a full adder carry-out output.

3. The base cell of claim 1, wherein the output of the first 2:1 multiplexer represents a first function comprising a multi-input logic function of the first, second, third, fourth, fifth and sixth input signals to the base cell.

4. The base cell of claim 1, wherein the output of the second 2:1 multiplexer represents a second function comprising a multi-input logic function of the fourth, fifth, sixth, seventh and eighth input signals to the base cell.

5. The base cell of claim 1, wherein the base cell comprises an integrated circuit constructed on a semiconductor substrate.

6. A base cell for a field programmable gate array, comprising:

a first inverter having an input and an output, the input of the first inverter operable to receive a first input signal to the base cell;

a NAND gate having a first input, a second input and an output, the first input of the NAND gate coupled to the output of the first inverter and the second input of the NAND gate operable to receive a second input signal to the base cell;

a first 2:1 multiplexer having a "0" input, a "1" input, a "select" input and an output, the "0" input of the first 2:1 multiplexer coupled to the output of the NAND gate and the "1" input of the first 2:1 multiplexer operable to receive a third input signal to the base cell, such that the output of the first 2:1 multiplexer represents a first function;

a second inverter having an input and an output, the input of the second inverter operable to receive a fifth input signal to the base cell;

a second 2:1 multiplexer having a "0" input, a "1" input, a "select" input and an output, the "0" input of the second 2:1 multiplexer operable to receive a fourth input signal to the base cell, the "1" input of the second 2:1 multiplexer coupled to the output of the second inverter, the "select" input of the second 2:1 multiplexer operable to receive a sixth input signal to the base cell, and the output of the second 2:1 multiplexer coupled to the "select" input of the first 2:1 multiplexer, such that the output of the second 2:1 multiplexer represents a partial sum function; and a third 2:1 multiplexer having a "0" input, a "1" input, a "select" input and an output, the "0" input of the third 2:1 multiplexer operable to receive a seventh input signal to the base cell, the "1" input of the third 2:1 multiplexer operable to receive an eighth input signal to the base cell and the "select" input of the third 2:1 multiplexer coupled to the output of the second 2:1 multiplexer, such that the output of the third 2:1 multiplexer represents a second function.

7. The base cell of claim 6, wherein the output of the first 2:1 multiplexer represents a full adder sum output and the output of the third 2:1 multiplexer represents a full adder carry-out output.

8. The base cell of claim 6, wherein the output of the first 2:1 multiplexer represents a first function comprising a multi-input logic function of the first, second, third, fourth, fifth and sixth input signals to the base cell.

9. The base cell of claim 6, wherein the output of the third 2:1 multiplexer represents a second function comprising a multi-input logic function of the fourth, fifth, sixth, seventh and eighth input signals to the base cell.

10. The base cell of claim 8, wherein the base cell comprises an integrated circuit constructed on a semiconductor substrate.

11. A base cell for a field programmable gate array, comprising:

a first inverter having an input and an output, the input of the first inverter operable to receive a second input signal to the base cell;

a first 2:1 multiplexer having a "0" input, a "1" input, a "select" input and an output, the "0" input of the first 2:1 multiplexer operable to receive a first input signal to the base cell and the "1" input of the first 2:1 multiplexer coupled to the output of the first inverter, such that the output of the first 2:1 multiplexer represents a first function;

a second inverter having an input and an output, the input of the second inverter operable to receive a third input signal to the base cell;

a NAND gate having a first input, a second input and an output, the first input of the NAND gate coupled to the output of the first inverter and the second input of the NAND gate operable to receive a fourth input signal to the base cell;

a second 2:1 multiplexer having a "0" input, a "1" input, a "select" input and an output, the "0" input of the second 2:1 multiplexer coupled to the output of the NAND gate, the "1" input of the second 2:1 multiplexer operable to receive a fifth input signal to the base cell, the "select" input of the second 2:1 multiplexer operable to receive a sixth input signal to the base cell, and the output of the second 2:1 multiplexer coupled to the "select" input of the first 2:1 multiplexer, such that the output of the second 2:1 multiplexer represents a partial sum function; and a third 2:1 multiplexer having a "0" input, a "1" input, a "select" input and an output, the "0" input of the third 2:1 multiplexer operable to receive a seventh input signal to the base cell, the "1" input of the third 2:1 multiplexer operable to receive an eighth input signal to the base cell and the "select" input of the third 2:1 multiplexer coupled to the output of the second 2:1 multiplexer, such that the output of the third 2:1 multiplexer represents a second function.

12. The base cell of claim 11, wherein the output of the first 2:1 multiplexer represents a full adder sum output and the output of the second 2:1 multiplexer represents a full adder carry-out output.

13. The base cell of claim 11, wherein the output of the first 2:1 multiplexer represents a first function comprising a multi-input logic function of the first, second, third, fourth, fifth and sixth input signals to the base cell.

14. The base cell of claim 11, wherein the output of the third 2:1 multiplexer represents a function comprising a multi-input logic function of the third, fourth, fifth, sixth, seventh and eighth input signals to the base cell.

15. The base cell of claim 15, wherein the base cell comprises an integrated circuit constructed on a semiconductor substrate.

* * * * *